United States Patent
Xiang et al.

(10) Patent No.: US 6,784,506 B2
(45) Date of Patent: Aug. 31, 2004

(54) SILICIDE PROCESS USING HIGH K-DIELECTRICS

(75) Inventors: Qi Xiang, San Jose, CA (US); Paul R. Besser, Sunnyvale, CA (US); Matthew S. Buynoski, Palo Alto, CA (US); John Clayton Foster, Mountain View, CA (US); Paul L. King, Mountain View, CA (US); Eric N. Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 41 days.

(21) Appl. No.: 09/939,744

(22) Filed: Aug. 28, 2001

(65) Prior Publication Data

US 2003/0042515 A1 Mar. 6, 2003

(51) Int. Cl.[7] .............................................. H01L 29/76
(52) U.S. Cl. ...................................... 257/410; 257/412
(58) Field of Search .......................... 257/59, 288, 347, 257/505, 524, 410, 412

(56) References Cited

U.S. PATENT DOCUMENTS

| | | |
|---|---|---|
| 5,153,145 A | 10/1992 | Lee et al. |
| 5,744,395 A | 4/1998 | Shue et al. |
| 5,747,373 A | 5/1998 | Yu |
| 5,843,820 A | 12/1998 | Lu |
| 5,851,890 A | 12/1998 | Tsai et al. |
| 5,866,473 A | 2/1999 | Xiang et al. |
| 5,904,517 A | 5/1999 | Gardner et al. |
| 5,960,270 A | 9/1999 | Misra et al. |
| 5,963,818 A | 10/1999 | Kao et al. |
| 5,972,804 A | 10/1999 | Tobin et al. |
| 5,973,372 A | 10/1999 | Omid-Zohoor et al. |
| 6,001,738 A | 12/1999 | Lin et al. |
| 6,004,878 A | * 12/1999 | Thomas et al. |
| 6,008,095 A | 12/1999 | Gardner et al. |
| 6,017,823 A | 1/2000 | Shishiguchi et al. |
| 6,025,267 A | 2/2000 | Pey et al. |
| 6,027,961 A | 2/2000 | Maiti et al. |
| 6,051,470 A | 4/2000 | An et al. |
| 6,063,698 A | 5/2000 | Tseng et al. |
| 6,107,667 A | 8/2000 | An et al. |
| 6,153,477 A | 11/2000 | Gardner et al. |
| 6,194,748 B1 | 2/2001 | Yu |
| 6,255,703 B1 | 7/2001 | Hause et al. |
| 6,327,443 B1 | * 12/2001 | Sckiguchi |
| 6,362,095 B1 | * 3/2002 | Woo et al. |

FOREIGN PATENT DOCUMENTS

JP          05218410       1/1992

* cited by examiner

Primary Examiner—Fetsum Abraham

(57) ABSTRACT

A method for preventing the thermal decomposition of a high-K dielectric layer of a gate electrode during the formation of a metal silicide on the gate electrode by using nickel as the metal component of the silicide.

2 Claims, 4 Drawing Sheets

SILICIDE PROCESS USING HIGH K-DIELECTRICS

FIELD OF INVENTION

This application pertains to a transistor with a gate electrode having a high-K gate dielectric with a nickel silicide layer and method of making the same.

BACKGROUND OF THE INVENTION

Standard gate semiconductor structures such as transistors and memory units are well known in the semiconductor device industry. Typically, to form a standard gate electrode, first a gate dielectric layer comprising silicon dioxide is formed on an active surface of a semiconductor substrate between isolation regions and then a polysilicon layer is formed on the dielectric layer. The layers of materials are then etched in a controlled manner to define the borders of the gate electrode. Source and drain regions are formed by doping the active surface of the substrate by ion doping by well know techniques. Dielectric sidewall spacers are formed on the side surfaces of the gate electrode to complete the device.

As both the vertical and lateral device dimensions decrease into the deep sub-micron range such as that associated with the formation of ultra-large scale integration (ULSI) devices, problems arise such as junction leakage and increased sheet resistance of the contact areas to the source and drain regions. To overcome these problems, the use of self-aligned, highly electrically conductive refractory metal silicides, i.e., "salicides" (derived from Self-ALIgned-siliCIDE), has become commonplace in the manufacture of IC semiconductor devices comprising, e.g., MOS type transistors. Salicide processing involves deposition of a metal that forms an intermetallic compound with silicon (Si). The metal does not react with silicon oxides, nitrides, or oxynitrides under normal processing conditions. Refractory metals commonly employed in salicide processing include platinum (Pt), titanium (Ti), nickel (Ni), and cobalt (Co), each of which forms very low resistively phases with Si, e.g., $PtSi_2$, $TiSi_2$, NiSi, and $CoSi_2$. In practice, the refractory metal is deposited in a uniform thickness over all exposed surface features of a Si wafer, preferably by means of physical vapor deposition ("PVD") process, e.g., sputtering from an ultra-pure target utilizing an ultra-high vacuum, multi-chamber DC magnetron sputtering system. Upon thermal processing, e.g., a rapid thermal annealing ("RTA") performed in an inert atmosphere, the refractory metal layer reacts with underlying Si to form an electrically conductive refractory metal silicide layer on the top surface of the polysilicon gate electrode as well as on the exposed surfaces of the substrate where source and drain regions are formed. Unreacted portions of the refractory metal layer, e.g., on the dielectric sidewall spacers and the silicon oxide isolation regions, are removed, as by a wet chemical etching process.

Also associated with the fabrication of ULSI devices, the thickness of the silicon dioxide dielectric for the gate electrode is rapidly approaching a thickness of 40 Å or less. At this thickness, the use of silicon dioxide as a gate dielectric is limited because direct tunneling may occur through the gate dielectric to the channel region, wherein current leaks from the gate electrode and the channel region. Such leakage of current causes an increase in power consumption. Because of this problem, alternative methods have been sought to reduce leakage current.

One such method is to use high-K dielectrics for gate dielectric materials. A high-K dielectric is any dielectric material having a dielectric constant greater than silicon dioxide that is 3.8. The dielectric constant of the high-K dielectric is preferably greater than 5.0, and more preferably, greater than 20.0. However, the use of high-K dielectrics for gate dielectric materials is disadvantageous because the high processing temperatures required for forming the salicide layer causes the dielectric to decompose due to the reaction of the dielectric with silicon in the semiconductor substrate and the polysilicon in the gate.

It has been discovered that by forming nickel silicide, the aforementioned problems are overcome. Lower temperatures are required to form nickel silicide, than for the other refractory metals. Also, Ni as opposed to other refractory metals such as Ti diffuses into Si, which helps to limit bridging between the metal silicide layer on the gate electrode and a metal silicide layer on the associated source/drain regions. Further, the formation of nickel silicide requires less Si than other refractory metals, such as Ti or Co. Nickel silicide also exhibits almost no line width dependence on sheet resistance. Advantageously, nickel silicide is normally annealed in a one step process, rather than the more complex process required in $TiSi_2$ and $CoSi_2$ salicide technology. Finally, nickel silicide exhibits lower film stress, i.e., causes less wafer distortion than conventional Ti or Co silicides.

SUMMARY OF THE INVENTION

An object of this invention is to provide for the formation of a self-aligned metal silicide on the gate, source and drain electrodes without deterioration of the high-K dielectric of the gate electrode. Another object is to provide for a nickel-silicide on a gate electrode including a high-K dielectric. A further object is to provide for a nickel silicide layer on the gate electrode being included a high-K dielectric material. Other objects, features and advantages of this invention will become apparent upon reading the following detailed description and referring to the accompanying drawing.

BRIEF DESCRIPTION OF THE DRAWINGS

The various novel features of this invention, along with the foregoing and other objects as well as the invention itself both as to its organization and method of operation, may be more fully understood from the following description of the illustrated embodiments when read in conjunction with the accompanying drawings, wherein.

DETAILED DESCRIPTION OF THE INVENTION

This invention relates to a method of making a semiconductor having a gate electrode which includes a high-K dielectric and a method of forming the semiconductor without decomposition or deterioration of the high-K dielectric. The high-dielectric layer is used to replace the conventional silicon dioxide gate dielectric to reduce gate tunneling leakage. The method is illustrated in FIGS. 1–8.

Figure 1:
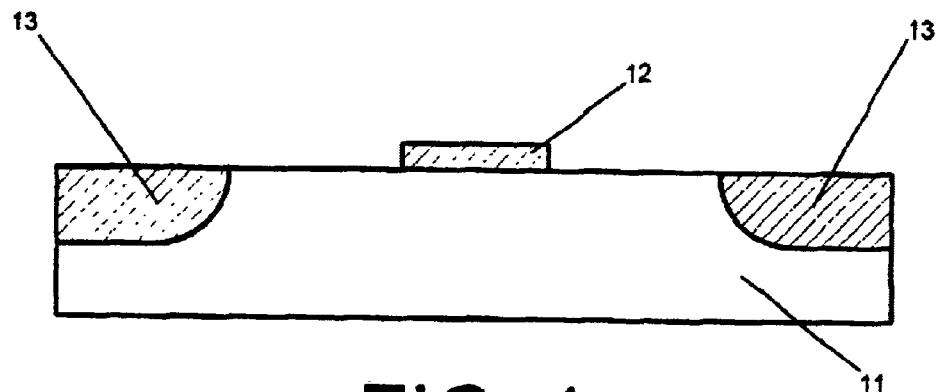
FIG. 1 depicts a partial cross-sectional view of a semiconductor topography wherein a high-K dielectric layer is formed between two shallow trench isolation regions.

The first step of the inventive method is shown in FIG. 1. A silicon based substrate 11 is provided. The substrate may be silicon wafer or silicon wafer bonded to insulator substrate, or epitaxally grown silicon. Preferably, the substrate is monocrystalline silicon wafer having one conductivity type (P or N). The substrate includes a plurality of separate well regions 13, each region comprising a field oxide (FOX) isolation region, a region formed by local oxidation of silicon (LOCOS), or a shallow trench isolation (STI) region. The STI is formed by the conventional method which is etching a shallow trench in the substrate, thermally oxidizing the trench, filling the oxidized trench with silicon dioxide deposited by chemical vapor deposition (CVD) and then chemically or mechanically polishing the surface. The STI is formed to a preferred depth of between 0.10 and 1.0 $\mu$m.

A high-K dielectric layer 12 is formed between two shallow trench isolation regions 13. A high-K dielectric layer is defined as a dielectric having a dielectric constant greater than that of silicon dioxide (dielectric constant of 4.2). In the present invention, the high-K dielectric is a material selected from the group consisting of silicon nitride having a dielectric constant between 6.0 and 8.0 (preferably 7.5), silicon oxynitride having a dielectric constant between 3.9 and 7.5, barium strontium titanate having a dielectric constant from about 20 to 200, tantalum pentoxide ($Ta_2O_5$) having a dielectric constant between 20 and 200, halfnium oxide (20 and 40), halfnium silicate having a dielectric constant between 10 and 20, zirconium oxide (20 and 40) zirconium silicate having a dielectric constant between 20 and 40, aluminum oxide, and lead zinc niobate. The preferred high-K dielectrics are halfnium and zirconium oxides and their silicates. The thickness of the high-K layer 12 is selected layer ranges from about 20 Å to about 200 Å, preferably from about 30 Å to about 100 Å thick.

While the high-K dielectric layers are thicker than the comparable $SiO_2$ dielectric layers, it will be appreciated that, for example, a 16 Å thick layer of tantalum oxide having a dielectric constant of 25 is equivalent to 4.0 Å of $SiO_2$ having a dielectric constant of 4.2 and a 80 Å layer of silicon nitride having a dielectric constant of 8.0 is equivalent to a 40 Å of $SiO_2$. The high-K dielectric is patterned by forming a photoresist mask pattern (not shown) over the high-K dielectric layer and then etching the dielectric layer, for example with $CHF_3$ and argon or by conventional anisotropic plasma etching or wet etching techniques to form high-K dielectric layer 12.

Figure 2:
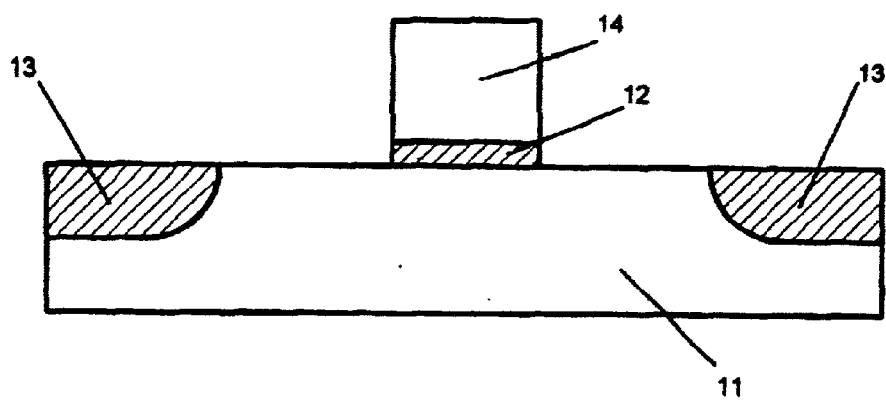
FIG. 2 depicts a partial cross-sectional view of a semiconductor topography wherein the gate electrode is formed between two shallow trench isolation regions.

In the second step of the invention is the formation of the polysilicon gate electrode as illustrated in FIG. 2. A blanket layer of polysilicon (not shown) is deposited on the high dielectric layer using CVD method. A layer of photoresist (not shown) is formed on the polysilicon layer. The photoresist is patterned and polysilicon layer 14 is selectively etched to form the gate electrode. The remaining photoresist (not shown) is removed and the structure as shown in FIG. 2 is the result. The thickness of the polysilicon layer is between about 500 Å and about 3000 Å, and preferably between about 800 Å and about 1300 Å.

Figure 3:
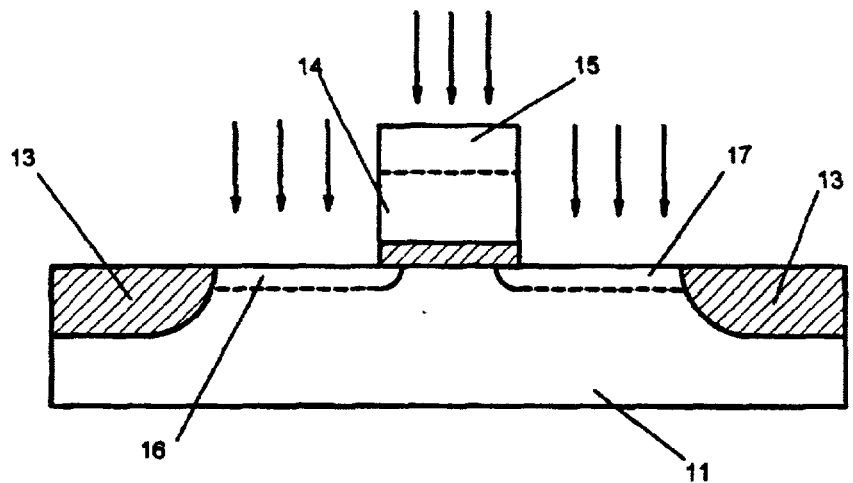
FIG. 3 depicts a partial cross-sectional view of a semiconductor topography wherein the semiconductor is treated with ions to form extension regions.

The third step of the inventive method is shown in FIG. 3. This step involves forming the source and drain extension regions. The regions are first impregnated by a preamorphous ion implantation process to form an $\alpha$-silicon layer. This layer is further bombarded with ions (shown in FIG. 3 by the arrows) by an extension ion implantation process to form source and drain extension regions 16 and 17, respectively. The upper surface 15 of the polysilicon gate electrode 14 is also doped by ion implantation. Arsenic or phosphorous containing ions or n-type dopant are employed if it is desired to form an NMOS device or boron containing ions are employed if it is desired to form a PMOS device. By way of illustration only, n-type source and drain extension regions having a shallow-depth of from about 100 to about 500 Å and a doping of from about $1 \times 10^{18}$ to about $1 \times 10^{20}$ da/$cm^3$ may be formed in crystalline Si by implanting arsenic containing ions at a dosage of from about $1 \times 10^{14}$ to about $1 \times 10^{15}$ da/$cm^2$ and energies of from about 1 to about 10 (KeV).

Figure 4:
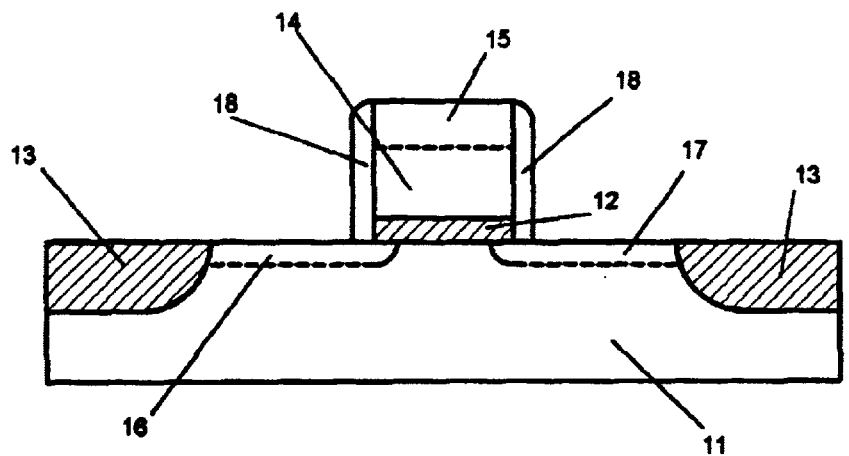
FIG. 4 depicts a partial cross-sectional view of a semiconductor topography wherein spacers are formed on the sidewalls of the gate electrode.

The fourth step of the inventive method is shown is to form silicon nitride spacers 18 on each side of the polysilicon gate electrode/high-K dielectric 15 and 12. Referring to FIG. 4, sidewall spacers 18 comprised of silicon nitride are formed on the surfaces of sidewalls of the gate electrode/gate dielectric layer stack 15/12. Typically, the sidewall spacers are formed by a a conventional process comprising the steps of depositing a blanket layer of silicon nitride covering all exposed surface portions of the substrate 11 as well as all exposed surfaces of the various features formed therein or thereon, including, inter alia, the opposing sidewall surfaces and top surface 15 of polysilicon layer 14 and then subjected to an anisotropic etching process, e.g., plasma etching in a fluorine-containing plasma, for selectively removing the laterally extending portions thereof and forming the sidewall spacers 18. The thickness of the silicon nitride is selected so as to provide tapered sidewall spacers 18 having a desired width profile.

Figure 5:
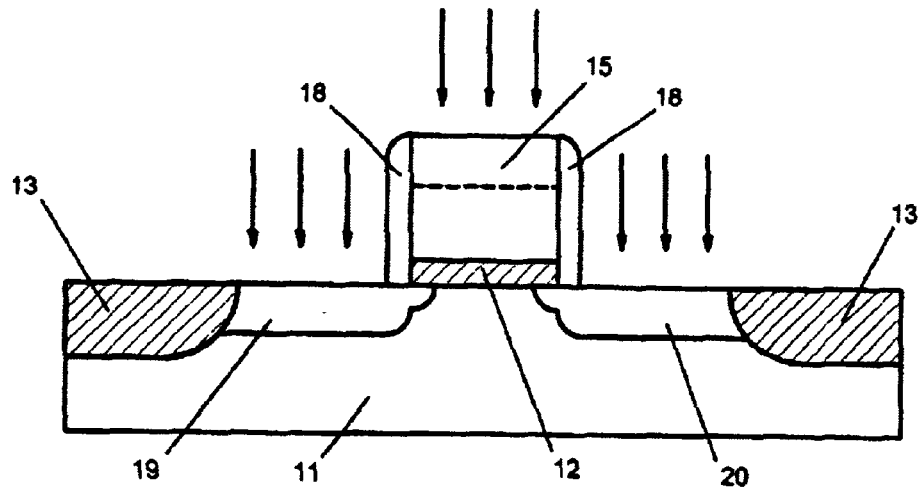
FIG. 5 depicts a partial cross-sectional view of a semiconductor topography wherein the semiconductor is treated with ions to form the deep preamorphous ion implantation.

In the fifth step of the inventive method, the formation of the source and drain regions, which was started by forming extensions 16 and 17, respectively, is completed as shown in FIG. 5 by implanting additional dopant into the source and drain regions 19 and 20. Following the formation of the sidewall spacers 18, a pair of deeper, more heavily-doped source and drain regions 19 and 20 are formed, as by a "main implant" ion implantation process utilizing the sidewall spacers 18 as implantation masks, generally within the portions of substrate 11 where the shallow-depth, lightly-doped source and drain extension regions 16 and 17 were previously formed. As shown in FIG. 5, the more heavily-doped source and drain regions 19 and 20 formed by the "main implant" process extend beyond the depth of source and drain extension regions 16 and 17, except at the portions of the latter regions underlying the sidewall spacers 18. By way of illustration only, according to conventional practice, typical arsenic implantation conditions for forming source and drain regions 19 and 20 of a Si wafer-based NMOS transistor having a peak arsenic n-type dopant concentration of from about $1 \times 10^{18}$ to about $1 \times 10^{20}$ da/$cm^3$ at a depth of from about 800 to about 1200 Å below the surface of the Si wafer include dosages of from about $5 \times 10^{14}$ to about $5 \times 10^{15}$ da/$cm^2$ and energies of from about 20 to about 50 (KeV).

Figure 6:
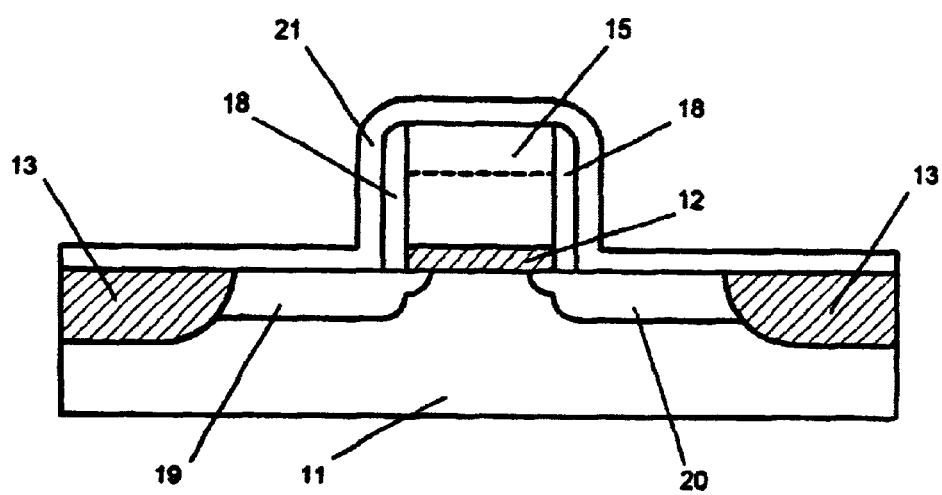
FIG. 6 depicts a partial cross-sectional view of a semiconductor topography wherein a nickel layer is form over the semiconductor.
Figure 7:
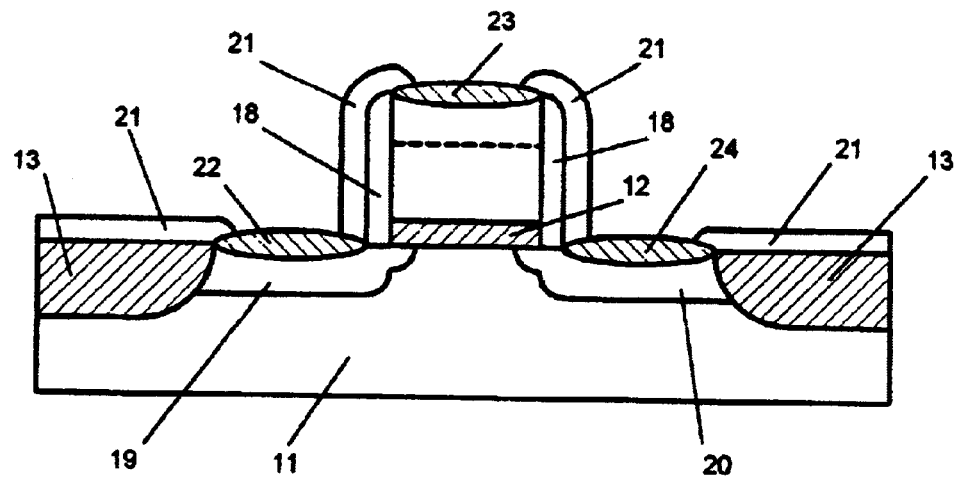
FIG. 7 depicts a partial cross-sectional view of a semiconductor topography wherein nickel suicide is formed.
Figure 8:
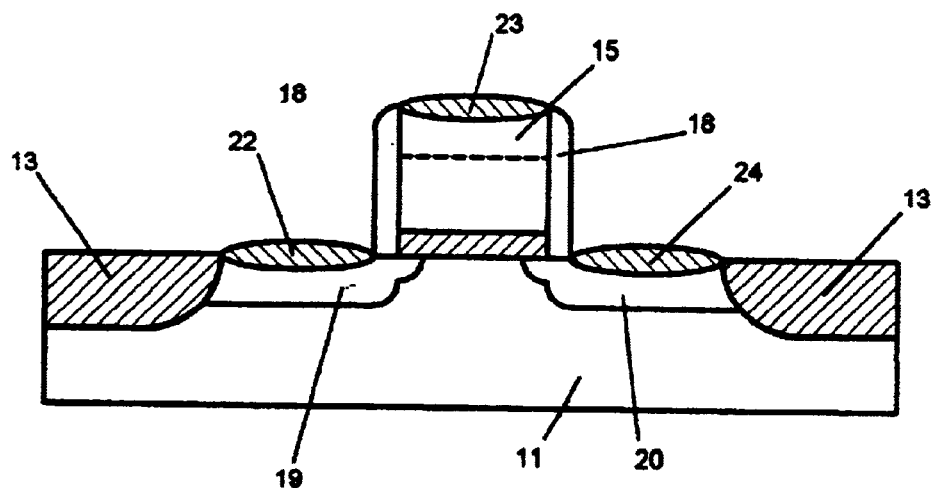
FIG. 8 depicts a partial cross-sectional view of a semiconductor topography wherein regions not forming nickel silicide are removed.

With reference to FIG. 6, in the next step, a blanket layer 21 of Ni by a PVD process such as DC sputtering, to cover all exposed surfaces of the thus-formed structure. The conversion of Ni to NiSi may be accomplished by means of a one-step thermal process, typically RTA performed at temperatures of from about 350° to about 750° C., for example, in a nitrogen-containing inert atmosphere at 550° C. for about 40 sec. to yield the structure shown in FIG. 8. Nickel silicides 22 and 24 are formed over the source and drain regions, respectively, and a silicide layer 23 forms on the surface of the polysilicon gate. The thickness of nickel silicides 22 and 24 is from about 200 Å to about 500 Å while the thickness of silicide layer 23 is from about 200 Å to about 500 Å. The unreacted portions of the Ni layer 21 formed over the sidewall spacers 18 and STI regions 13 are selectively removed, for example, by etching with a 2:1 $H_2SO_4/H_2O_2$ mixture at a temperature of about 100° C. The structure in FIG. 8 can then undergo further processing for contact formation to the source/drain regions and the gate electrode.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalence thereof may be resorted to, falling within the scope of the invention claimed.

What is claimed is:

1. A semiconductor comprising a gate electrode on a surface of a semiconductor substrate between two active regions, the gate electrode having sidewalls and comprising a layer of high-K dielectric on the surface of the semiconductor substrate and a polysilicon layer on said high-K dielectric, spacers on the sidewalls of said gate electrode, and a nickel silicide layer on said active regions and on said polysilicon layer, wherein the high-K dielectric is $Ta_2O_5$.

2. A semiconductor of claim 1 wherein the spacers comprise silicon nitride.

* * * * *